United States Patent

Farkas et al.

[19]

[11] Patent Number: 5,935,871
[45] Date of Patent: Aug. 10, 1999

[54] PROCESS FOR FORMING A SEMICONDUCTOR DEVICE

[75] Inventors: Janos Farkas; David Watts, both of Austin; Melissa Freeman, Round Rock, all of Tex.

[73] Assignee: Motorola, Inc., Schaumburg, Ill.

[21] Appl. No.: 08/916,297

[22] Filed: Aug. 22, 1997

[51] Int. Cl.⁶ .................................................. H01L 21/00
[52] U.S. Cl. .......................... 438/693; 438/754; 216/38; 216/89; 134/2
[58] Field of Search .................................... 438/692, 693, 438/754; 216/38, 88, 89; 134/2, 26

[56] References Cited

U.S. PATENT DOCUMENTS

| | | | |
|---|---|---|---|
| 5,525,191 | 6/1996 | Maniar et al. | 156/636.1 |
| 5,770,095 | 6/1998 | Sasaki et al. | 438/693 X |
| 5,773,364 | 6/1998 | Farkas et al. | 438/693 X |

OTHER PUBLICATIONS

Vogt, et al., "Plasma Deposited Dielectric Barriers for Cu Metallization", Electrochemical Society Proceedings, vol. 96–12, pp. 613–622 (1996).

Jeon, et al., "Aspects of Alumina Particle Deposition Onto CVD Tungsten Wafers Relevant to Post CMP Cleaning", Electrochemical Society Proceedings, vol. 95–20, pp. 581–588, (1995).

*Primary Examiner*—William Powell
*Attorney, Agent, or Firm*—George R. Meyer

[57] ABSTRACT

A process has been developed for a post-chemical mechanical polishing cleaning/passivting step to remove slurry particles (52) and form a passivating film (64) from a portion of an interconnect material within a conductive layer (42) without attacking the interconnecting material. In one particular embodiment, a solution having a pH greater than the isoelectric point of alumina particles is exposed to the surface of an interconnect material of a conductive layer (42) to passivate a portion of the interconnect material while changing the charge of the slurry particles (52) such that they are repelled away from the surface of the substrate and removed by the cleaning solution, or other cleaning processes.

21 Claims, 3 Drawing Sheets

PROCESS FOR FORMING A SEMICONDUCTOR DEVICE

RELATED APPLICATIONS

This is related to U.S. patent application Ser. No. 08/734,566 filed Oct. 21, 1996, U.S. Pat. No. 5,773,364 and U.S. patent application Ser. No. 08/684,782 filed Jul. 22, 1996, both of which are assigned to the current assignee hereof.

FIELD OF THE INVENTION

This invention relates in general to processes for forming semiconductor devices, and more particularly, to processes for forming in-laid interconnects within semiconductor devices.

BACKGROUND OF THE INVENTION

Chemical mechanical polishing is becoming a common process for forming interconnects within a semiconductor device. Currently, in-laid interconnects, whether single or dual, are being developed for use in advanced semiconductor devices. Typically, the interconnects include copper or aluminum. During the polishing process, a slurry that includes a liquid and particles, such as alumina particles, is used to remove portions of the conductive layer that overlie an insulating layer. After the removal step, the substrate surface is cleaned. During this cleaning step, the surface of the insulating layer, which is typically oxide, has a negative charge and attracts positively charged particles. Alumina has an isoelectric point at a pH of approximately 9. Therefore, in the presence of water, which has a pH of approximately 7, the oxide surface will have a negative charge and will attract the positively charged alumina particles.

One way to remove the particles is to increase the pH of the solution by adding ammonium hydroxide so that the positively charged alumina particles become negatively charged and are repelled by the oxide surface. While this works for tungsten, it is difficult to use a solution with a high pH for aluminum or copper because ammonia will react with copper to form copper-ammonium complexes, or, in the case of aluminum, will attack the aluminum causing corrosion or pits.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

A process has been developed for a post-chemical mechanical polishing cleaning/passivating step to remove slurry particles and passivate the surface of an interconnect material of a conductive layer without attacking the interconnecting material. In one particular embodiment, a solution having a pH greater than the isoelectric point of alumina particles is exposed to the surface of an interconnect material of a conductive layer to passivate a portion of the interconnect material while changing the charge of the slurry particles such that they are repelled away from the surface of the substrate and removed by the cleaning/passivating solution, or other cleaning or rinsing processes. Formation of ammonium complexes, corrosion or pitting should not occur. The present invention is better understood with the embodiments that are described below.

Figure 1:
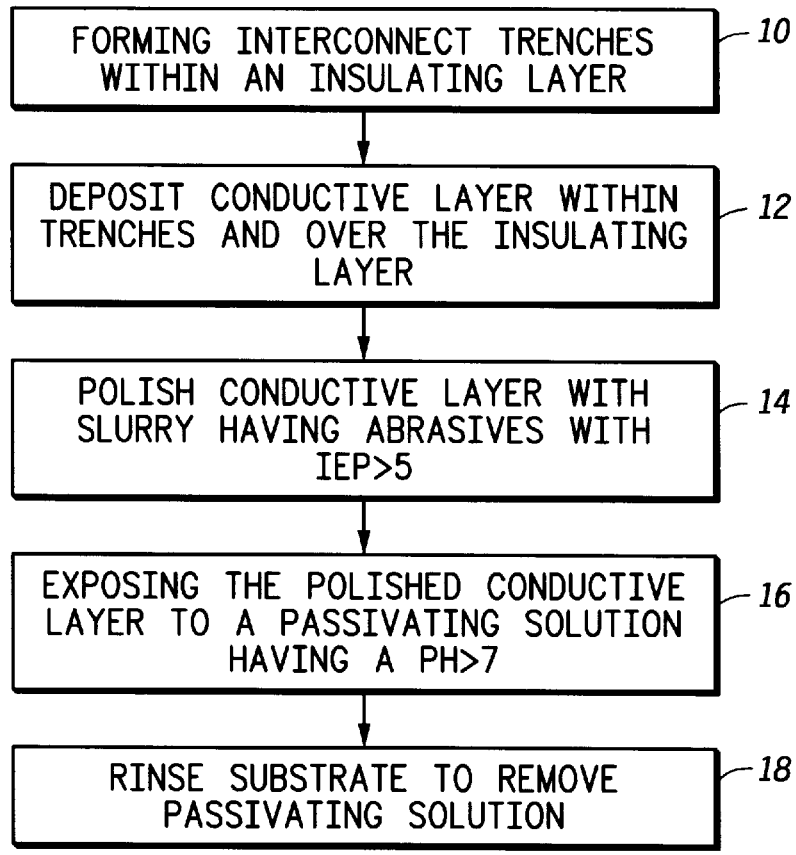
FIG. 1 includes a process flow diagram for polishing a substrate in accordance with an embodiment of the present invention.

FIG. 1 includes a process flow diagram of an embodiment of the present invention. An insulating layer is deposited over a substrate and patterned to form interconnect trenches within that insulating layer in step 10. A conductive layer is deposited within the interconnect trenches and over the insulating layer in step 12. The conductive layer is then polished with a slurry having abrasives with an isoelectric point (IEP) at a pH of at least 5 in step 14. As used in this specification, the IEP of a material is the pH at which the material has a neutral charge within a solution. At a pH lower than the IEP, the material has a positive charge, and at a pH higher than the IEP, the material has a negative charge. IEP is typically expressed in relation to a pH of a solution. The polished conductive layer is then exposed to a passivating solution having a pH greater than 7 in step 16. After the passivating solution exposure, the substrate is rinsed to remove any portions of the passivating solution remaining on the exposed surfaces in step 18. Further processing is continued to dry and further deposit and pattern additional layers as required to form a semiconductor device but are not shown in FIG. 1.

Figure 2:
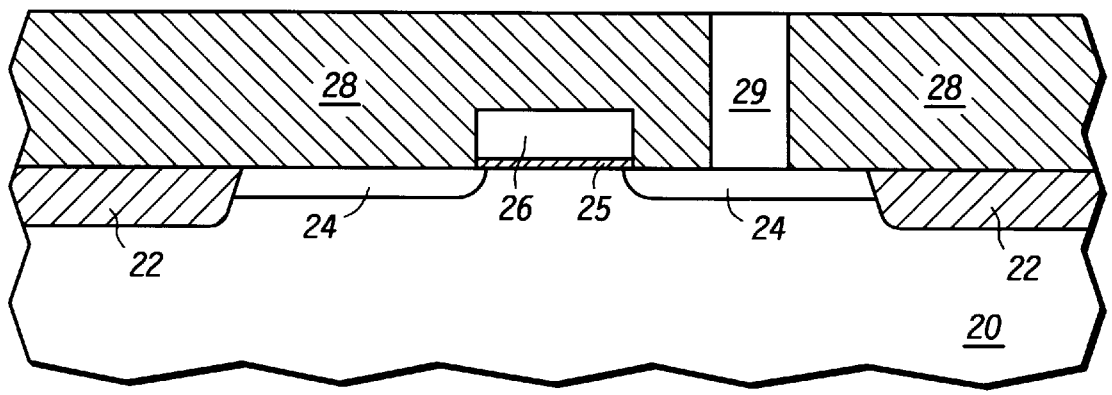
FIGS. 2–7 include illustrations of cross-sectional views in forming a semiconductor device in accordance with an embodiment of the present invention.

FIG. 2 includes an illustration of a cross-sectional view of a portion of the semiconductor device substrate after performing several processing steps. FIG. 2 includes the semiconductor device substrate 20, field isolation regions 22, and doped regions 24 that lie within the semiconductor device substrate 20. As used in this specification, the semiconductor device substrate 20 includes a monocrystalline semiconductor wafer, a semiconductor-on-insulating wafer, or any other substrate used to form semiconductor devices. The field isolation regions 22 are formed by any conventional manner including local oxidation of silicon (LOCOS) or trench isolation. The doped regions 24 typically have a conductivity type opposite that of the semiconductor device substrate 20. A gate dielectric layer 25 is formed over the semiconductor device substrate 20 and portions of the doped regions 24. A gate electrode 26 is formed over the gate dielectric layer 25 and typically includes a conductive material such as doped silicon, doped silicon germanium, or a silicide material.

An interlevel dielectric (ILD) layer 28 is formed over the substrate 20 and the gate electrode 26. In some embodiments, the ILD layer 28 can include a plurality of films such as an undoped oxide film in contact with the doped regions 24 and a doped oxide film overlying the undoped oxide film. The doped oxide film typically includes borophosphosilicate glass, phosphosilicate glass, or the like. The ILD layer 28 is patterned to form a contact opening to expose a portion of the doped region 24. A conductive plug 29 is formed within the contact opening. The conductive plug 29 typically includes an adhesion/barrier film and a tungsten film. In this particular embodiment, the adhesion/barrier film can include a titanium nitride composite.

Figure 3:
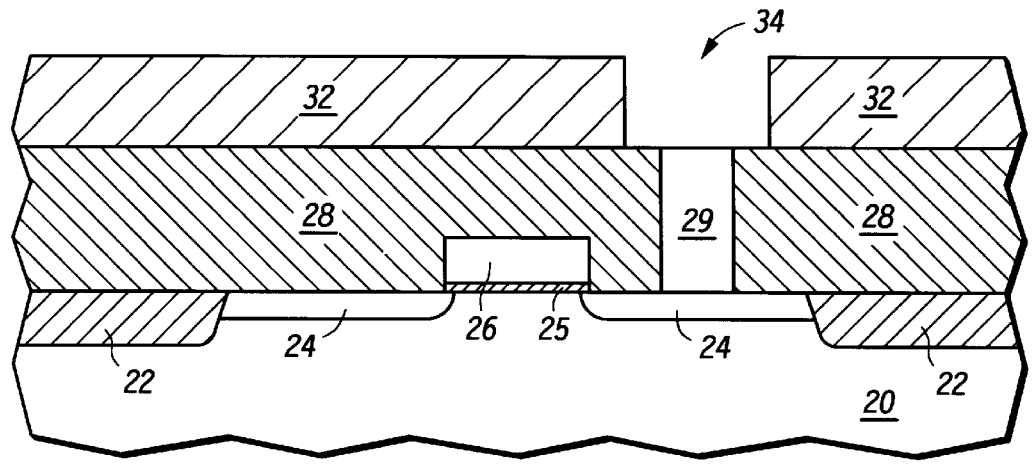

An insulating layer 32 is then formed over the ILD layer as shown in FIG. 3. The insulating layer 32 includes oxide, nitride, or the like and is patterned to form interconnect trenches 34, which expose the conductive plug 29 as illustrated in FIG. 3. The interconnect trenches 34, one of which is shown in FIG. 3, will be used to route interconnects to and from various portions of the semiconductor device.

Figure 4:
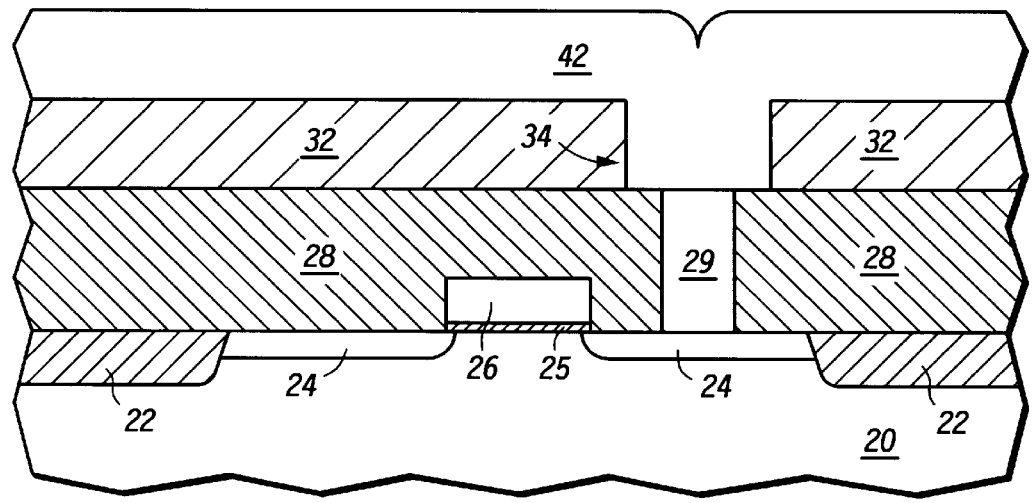

A conductive layer 42 is then deposited over the insulating layer 32 and within the interconnect trench in FIG. 4. In one particular embodiment, an adhesion/barrier film is formed in direct contact with the insulating layer 32 and along with walls and bottom of the interconnect trenches. The other portion of the conductive layer typically includes an interconnecting material such as aluminum, copper or the like. Currently, the adhesion/barrier film includes a material (s) such as titanium/titanium nitride or tantalum/tantalum nitride, or similar compounds. The thickness of this adhesion/barrier film is typically in a range of approximately 200–600 angstroms thick. The interconnecting material is typically aluminum or copper and is deposited to a thickness in a range of approximately 4,000–10,000 angstroms. However, in future generations of devices, the thickness is expected to decrease to 2,000 angstroms or possibly even thinner. The processing steps up to this point in the process are conventional.

Figure 5:
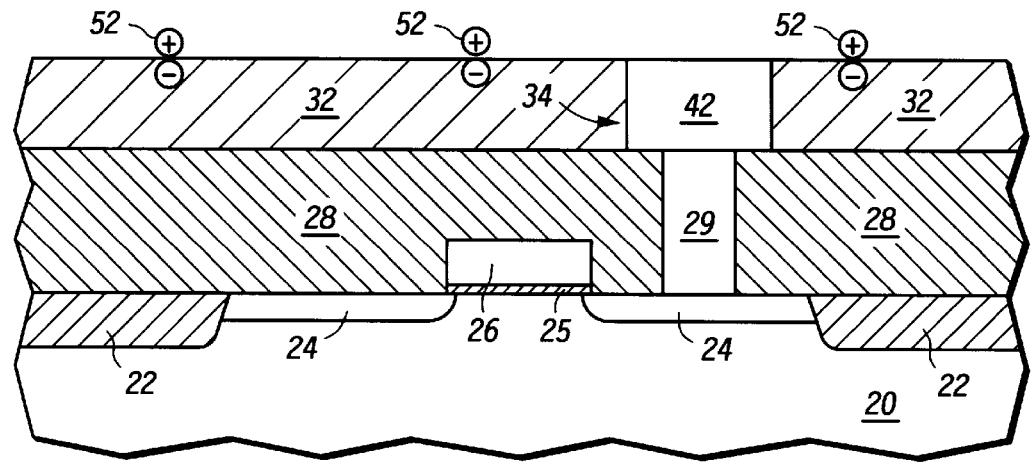

The conductive layer 42 is then polished to remove portions of the conductive layer 42 lying outside the interconnect trenches 42 in FIG. 5. The polishing is typically performed using particles having an isoelectric point at a pH of at least 5. Specific examples include alumina ($Al_2O_3$) particles, which has an isoelectric point at a pH of approximately 9; ceria ($CeO_2$) particles, which have an isoelectric point at a pH of approximately 6.8; ceria trioxide ($CeO_3$) particles, which have an isoelectric point at a pH of approximately 9.6; magnesium oxide (MgO) particles, which have an isoelectric point at a pH of approximately 12.4; titanium dioxide ($TiO_2$) particles, which have an isoelectric point at a pH of approximately 6.2; and zirconia ($ZrO_2$) particles, which have an isoelectric point at a pH of approximately 6.2. After the polishing is performed, the insulating layer 32 typically has a negative charge near its surface as illustrated in FIG. 5. During a cleaning/passivating step, the particles 52 are positively charged because the polishing conditions are generally performed at a pH lower than the isoelectric point. These positively charged particles 52 are attracted to the negative charge lying at the surface of the insulating layer 32. The problem is to remove the positively charged particles 52 without damaging the interconnect material within conductive layer 42.

Figure 6:
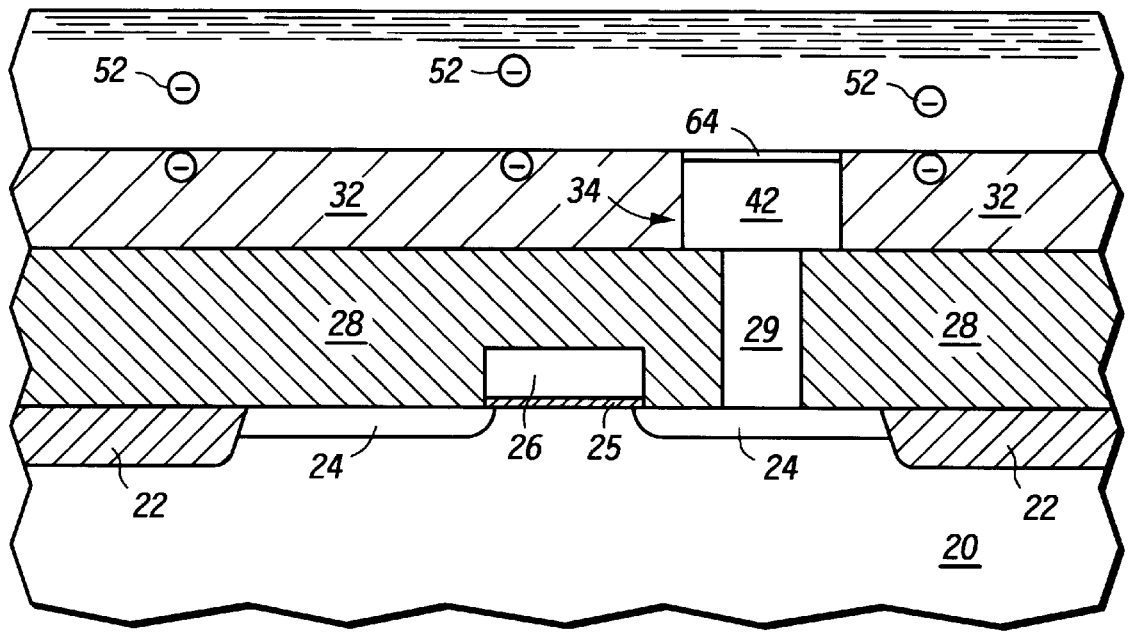

A cleaning/passivating solution is then used to convert the particles from a positive charge to a negative charge that is repelled by the negative charge lying at the surface of the insulating layer 32 as illustrated in FIG. 6. The composition of the cleaning/passivating solution 62 will vary depending on the interconnect material used. In one embodiment, the interconnecting material of conductive layer 42 is primarily copper. The cleaning/passivating solution 62 includes an organic, nitrogen-containing compound. Examples include aliphatic or aromatic amines, such as tetramethylammonium hydroxide, phenylamine, n-butylamine, and the like. Other compounds can be used, but the primary component should include an organic group that is attached to the nitrogen atom. This amine compound reacts with a surface of the copper within the conductive layer 42 to form a passivating film 64 of a copper oxide that protects the copper from being attacked by the cleaning/passivating solution 62. Therefore, the pH can be taken to a pH higher than 9, which would cause alumina particles to be repelled by the insulating layers' surface charge. The thickness of the passivating film 64 is typically less than approximately 100 angstroms but varies depending on the conditions used.

Embodiments of the present invention can also be used where the interconnecting material within the conductive layer 42 is aluminum. In this particular embodiment, an ionic silicate should be used. Examples of an ionic silicate includes tetramethylammonium silicate, tetrabutylammonium silicate, or the like. The negatively charged silicate ions react with the surface of the aluminum within the conductive layer 42 to form the passivating film 64. This allows the pH of the passivating solution 62 to be taken high enough to change the charge of the alumina particles without attacking the aluminum within the conductive layer 42.

Figure 7:
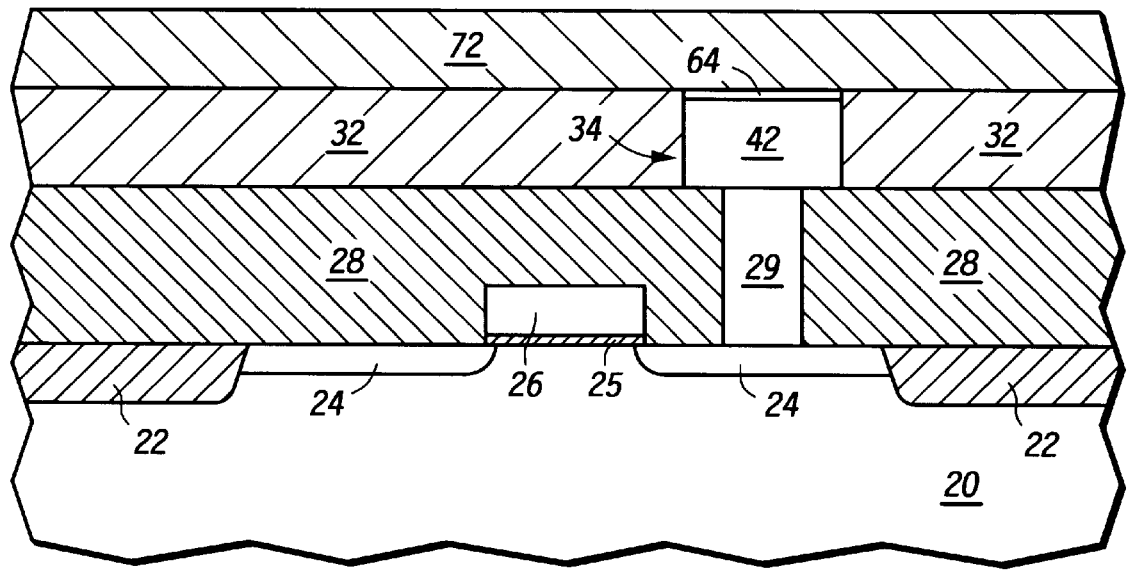

After the cleaning/passivating solution exposure, the substrate is dried and further processed to form a substantially completed device as shown in FIG. 7. This process forms single in-laid interconnects. In this particular embodiment, a passivation layer 72 has been formed over the passivating film 64 and conductive layer 42 as well as the insulating layer 32. Other conductive plugs and interconnects are formed but are not shown in FIG. 7. In other embodiments, additional ILD layers and interconnects can be formed. Also, the present invention can be used in forming dual in-laid interconnects, which are interconnects in which vias and interconnect trenches are filled with the conductive layer and polished. In any event, the passivation layer 72 is formed over the uppermost level of interconnects.

The present invention is not limited to the embodiments previously described. For example, other types of materials can be used for the conductive layer and include cobalt, nickel, rhodium, palladium, silver, iridium, platinum, gold, or the like. Further, the particles used for the CMP polishing could include nitride materials such as silicon nitride ($Si_3N_4$), aluminum nitride (AlN), titanium nitride (TiN), or the like. In any event, the isoelectric points of these materials are relatively high and typically require a basic pH to change its charge in order for it to be repelled by the surface of the insulating layer.

Embodiments of the present invention have benefits over the prior art methods. Particularly, in the embodiments previously described, a passivation film 64 is formed along the surface of the conductive layer 42 to protect the interconnecting material within the conductive layer 42 from being attacked by a post-CMP treating solution that is to remove the particles. Specifically in the case of copper, a copper oxide is formed up to a pH of approximately 12.5 and is not etched by the amine complexes. Cleaning/passivating is typically performed using a solution with a pH is a range of approximately 10–11 when alumina particles are used. The pH is sufficiently high enough to change the charge of the alumina particles without attacking the underlying copper within the conductive layer. In this particular embodiment though, care should be used not to go to a pH higher than approximately 12.5 as the passivation film can react, break down, or decompose allowing the copper to be attacked. Further other considerations may limit the pH, such as equipment materials compatibility or other issues not directly related to the semiconductor devices. However, this is a practical concern and not a limitation on the invention.

Note that metal polishing is typically performed using an acidic polishing slurry and the slurry may include an organic amine. In those particular situations, the polishing slurries are generally kept to a pH of about 4 or lower which would allow a positively charged alumina particle to be attracted to the negatively charged oxide surface. The cleaning/passivating in accordance with embodiments of the present invention occur after the polishing has been performed. Unlike metal polishing, cleaning/passivating is typically performed using a solution at a higher pH. The higher pH allows particles to be repelled. Cleaning/passivating solutions of embodiments of the present invention enhance particle removal without the cleaning solution attacking the conductive layer 42.

The cleaning/passivating process is performed any time between polishing the conductive layer and depositing the next layer over the polishing conductive layer. In one embodiment, the cleaning/passivating is performed on a mechanical scrubbing system after the substrate has been processed on a finishing pad. In other embodiments, the cleaning/passivating solution can be introduced during processing of the substrate on the finishing pad, as opposed to the polishing pad. In still other embodiments, the cleaning/passivating can be performed in an ultrasonic or megasonic sink.

In further embodiments, a passivating film does not need to be formed. If a passivating film is not formed, the cleaning/passivating solution and all materials within it should be relatively inert (not react) with respect to the interconnecting material within the conductive layer 42.

Another advantage of the embodiments of the present invention is that they can be used without having to make equipment changes or developing marginal or complex processing steps. In one particular embodiment having a copper conductive layer and alumina particles, a tetramethyl ammonium hydroxide (TMAH) compound can be added to an aqueous solution such that the TMAH makes up only approximately two weight percent of the cleaning/passivating solution. Typically, the TMAH makes up approximately 0.1 to 5.0 weight percent of the cleaning/passivating solution Another advantage of the present invention is that some of the chemicals used within the cleaning/passivating solution are currently available in semiconductor grade formulations. For example, TMAH is used in photoresist developing. Because the material is already available in semiconductor grade formulas, embodiments of the present invention can be used relatively quickly without having to have a compound specifically developed by a chemical company.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A process for forming a semiconductor device comprising the steps of:
    forming a conductive layer over a substrate;
    polishing the conductive layer with a slurry having abrasive particles, wherein the abrasive particles have an isoelectric point at a pH greater than approximately 5; and
    contacting the conductive layer and substrate with a cleaning solution having a pH greater than a pH corresponding to the isoelectric point of the abrasive particles, wherein the cleaning solution includes a material selected from a group consisting of an organic amine and a silicate.

2. The process of claim 1, wherein the pH of the cleaning solution is greater than 7.

3. The process of claim 1, wherein the abrasive particles comprise a material selected from a group consisting of alumina, ceria, ceria trioxide, magnesium oxide, titanium dioxide, and zirconia.

4. The process of claim 1, wherein the conductive layer comprises aluminum, and the cleaning solution comprises the silicate.

5. The process of claim 4, wherein the cleaning solution comprises a material selected from a group consisting of tetramethylammonium silicate, potassium silicate, and tetrabutylammonium silicate.

6. The process of claim 1, wherein the conductive layer comprises copper and the cleaning solution comprises an amine.

7. The process of claim 6, wherein the cleaning solution comprises a material selected from a group consisting of tetramethylammonium hydroxide, terabutylammonium hydroxide, n-butylamine, ethylenediamine, and phenylamine.

8. The process of claim 1, further comprising a step of:
    rinsing the substrate to remove the cleaning solution and abrasive particles from the substrate.

9. The process of claim 1, further comprising steps of:
    forming a patterned insulating layer over the substrate before the step of forming the conductive layer, wherein the patterned insulating layer has an isoelectric point at a pH lower than approximately 7; and
    forming a passivation layer over the patterned insulating layer after the step of contacting.

10. The process of claim 1, wherein the material and the conductive layer are:
    substantially inert with respect to each other; or react with each other to form a passivating film.

11. The process of claim 10, wherein the passivating film includes an oxide of the material and has a thickness less than approximately 100 angstroms.

12. A process for forming a semiconductor device comprising the steps of:
    forming a conductive layer over a substrate, wherein the conductive layer includes a material selected from a group consisting of cobalt, nickel, copper, aluminum, rhodium, palladium, silver, iridium, platinum, and gold;
    polishing the conductive layer with a slurry having abrasive particles, wherein the abrasive particles have an isoelectric point at a pH greater than approximately 5; and
    contacting the conductive layer with a cleaning solution having a pH greater than a pH corresponding to the isoelectric point of the abrasive particles.

13. The process of claim 12, wherein the pH of the cleaning solution is greater than 7.

14. The process of claim 12, wherein the abrasive particles comprise at least one material from the group consisting of alumina, ceria, ceria trioxide, magnesium oxide, titanium dioxide, and zirconia.

15. The process of claim 12, wherein the conductive layer comprises aluminum.

16. The process of claim 12, wherein the conductive layer comprises copper.

17. The process of claim 12, wherein the cleaning solution comprises a material selected from a group consisting of organic amines and ionic silicates.

18. The process of claim 12, wherein the material and the conductive layer are:

substantially inert with respect to each other; or react with each other to form a passivating film.

19. The process of claim 18, wherein the passivating film includes an oxide of the material and has a thickness less than approximately 100 angstroms.

20. The process of claim 12, further comprising the step of:

rinsing the substrate to remove the cleaning solution and abrasive particles from the substrate.

21. The process of claim 12, further comprising steps of:

forming a patterned insulating layer over the substrate before the step of forming the conductive layer, wherein the patterned insulating layer has an isoelectric point at a pH lower than approximately 7; and forming a passivation layer over the patterned insulating layer after the step of contacting.

* * * * *